United States Patent

Schaedeli et al.

[11] Patent Number: 6,146,793
[45] Date of Patent: Nov. 14, 2000

[54] RADIATION SENSITIVE TERPOLYMER, PHOTORESIST COMPOSITIONS THEREOF AND 193 NM BILAYER SYSTEMS

[75] Inventors: Ulrich Schaedeli, Hockessin, Del.; Andrew J. Blakeney, Seekonk, Mass.; Thomas Steinhäusler, Riverside, R.I.; Daniela White, Pittsburgh, Pa.; Allen H. Gabor, Summit, N.J.

[73] Assignee: Arch Specialty Chemicals, Inc., Norwalk, Conn.

[21] Appl. No.: 09/255,589

[22] Filed: Feb. 22, 1999

[51] Int. Cl.$^7$ ................ G03F 7/004; G03F 7/36
[52] U.S. Cl. ............ 430/18; 430/270.1; 430/323; 430/326; 430/910
[58] Field of Search ............... 403/270.1, 910, 403/326, 323, 18

[56] References Cited

U.S. PATENT DOCUMENTS

| | | | |
|---|---|---|---|
| 4,839,109 | 6/1989 | Kaetsu et al. | 264/1.4 |
| 5,395,734 | 3/1995 | Vogel et al. | 430/270 |
| 5,856,071 | 1/1999 | Kotachi et al. | 430/326 |

*Primary Examiner*—John S. Chu
*Attorney, Agent, or Firm*—Ohlandt, Greeley, Ruggiero & Perle, L.L.P.

[57] ABSTRACT

A terpolymer with chemically amplified (acid labile) moieties and organosilicon moieties suitable for use as the binder resin for a photoimageable resist photoresist composition suitable for use in 193 nm photolithographic processes.

The terpolymers have the following structural units:

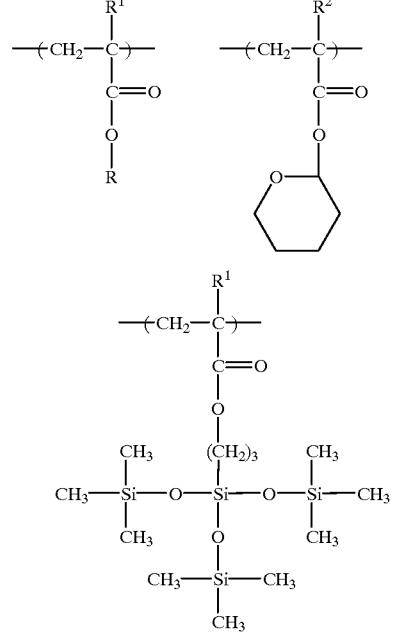

where R is a methyl or hydroxyethyl group, $R^1$ is a hydrogen atom, a methyl group or a —$CH_2COOCH_3$ group and $R^2$ and $R^3$ are each independently a hydrogen atom or a methyl group.

18 Claims, No Drawings

RADIATION SENSITIVE TERPOLYMER, PHOTORESIST COMPOSITIONS THEREOF AND 193 NM BILAYER SYSTEMS

FIELD OF THE INVENTION

This invention relates to a new radiation sensitive terpolymer for use as a top layer resist in a bilayer system for use in 193 nm photolithography. The invention also relates to radiation sensitive photoresist compositions comprising a new terpolymer and to a process for the lithographic treatment of a substrate by means of the photoresist composition, as well as a process for the production of electronic components using the new terpolymer in a radiation sensitive photoresist top layer coating in a 193 nm lithographic system.

BACKGROUND OF THE INVENTION

In recent years, the extent of integration of semiconductor components has been continually increasing. The resolution capacity that can be obtained with conventional deep-UV microlithography has thus appeared to reach its limits. Normally, it is not generally possible to produce, on a substrate, conventional structures with dimensions of less than 0.25 µm, as is required for the production of particularly highly integrated electronics components. These components generally have minimal dimensions down to approximately 0.12 µm. In order to be able to resolve sufficiently, in an optical manner, such fine structural elements, particularly short-wave radiation must be utilized, which generally has a wavelength between 190 and 260 nm.

However, present conventional G-line, I-line and deep-UV (DUV) photoresistant materials are poorly suited for radiation of such wavelength. These conventional materials are usually based on phenolic resins as binders, for example, on novolak resins or on chemically amplified polyhydroxystyrene derivatives with acid labile groups, which show a strong absorption at wavelengths below 260. This leads to the fact that, with the use of such radiation, the side walls of the finished developed resist structures do not form the targeted right angle, but rather form a more or less oblique angle with the substrate or the resist surface, which nullifies the obtaining of optical resolution as a consequence of the use of shortwave radiation.

Photoresists without a sufficiently high proportion of aromatic components, e.g., resists based on methacrylate resins, have proven sufficiently transparent for radiation below 260 nm, but they do not have the plasma etch resistance that is customary for resists based on aromatic resins; plasma etching being one principal method for producing microstructures on silicon substrates. The plasma etch resistance, as is known, is essentially based on the aromatic groups in these resists.

ArF excimer base (193 nm) lithography is a prime candidate for sub 0.18 µm lithography. The leading resist technology approaches for practical 193 nm lithography are top surface imaging (TSI) bilayer resists and single layer. Each approach has its own characteristic advantages and disadvantages as the result of the underlying technology and the materials, which can be utilized. The numerous problems for the 193 nm photoresist chemists to solve, (e.g., transparency, photospeed, adhesion, sensitivity, various process time delay latitudes, and plasma etch resistance), are somewhat different for each technology due to the materials requirements.

Lithographic aspect ratios and other issues require that resist films be thinner (about 0.5 µm) for sub 0.18 µm devices. This, in turn, requires either greatly improved etch processes or improved etch resistance or both. Thus, having excellent plasma etch resistance is critical and it is preferable that it be even better than before because of the thinner films. This presents a materials problem to the resist chemist because now both the aromatic character and the alkali-solubilizing group must be replaced. Thus, new materials, or groups of materials, with high transparency, etch resistance, and a different alkali-solubilizing group are required.

Alicyclic polymers have been found to be transparent enough at 193 nm and to have reasonable plasma etch resistance. However, the alicyclic resins in their "pure state" suffer from high hydrophobicity and adhesion problems. Modifications to improve these and other properties tend to decrease the plasma etch resistance significantly below that of novolac based resins and offer little hope of improved etch resistance.

There have been various solutions proposed for this problem. One solution is offered by the use of a special multilayer technique, generally referred to as bilayer resists. First, an initial resin coating, commonly called an undercoat layer, which is not photoimageable, is introduced onto the substrate. This undercoat layer provides the plasma etch resistance when etching the substrate. A second covering coating layer that can be photoimaged, which contains an organosilicon component instead of a component with a high content of aromatic compounds, is introduced onto the first planarizing layer. The substrate coated in this way is selectively exposed, i.e., in an image-forming way, in the conventional manner and then treated with a suitable developer, so that a desired image-forming structure is generated in the covering coating that can be photostructured. A subsequently conducted treatment in oxygen plasma leads to the organosilicon compounds being oxidized to silicon oxides, at least on the surface, and these oxides form a closed etching barrier for the oxidative decomposition of the organic material that lies underneath, particularly the planarizing layer, while the planarizing layer is removed completely in an oxidative manner on those places that are not coated by the silicon-containing covering layer.

Such bilayer resists generally offer improved depth of focus, resolution, substrate compatibility, and aspect ratios.

While various polymers have been proposed for use in such photoimageable top layer compositions in a bilayer system for photolithography at 193 nm wavelength radiation there is still a need for improved polymers with improved lithographic properties for this purpose, and especially for a bilayer system to provide high resolution lithography at 193 nm radiation.

BRIEF SUMMARY OF THE INVENTION

The present invention provides a new terpolymer suitable for use for forming a top layer photoimageable coating in a 193 nm bilayer system providing high-resolution lithography. The present invention also provides a new photoresist composition for forming such a photoimageable coating on a substrate for use in 193 nm photolithography. The invention also provides such a terpolymer with chemically amplified (acid labile) moieties and organosilicon moieties suitable for use as the binder resin for a photoimageable etching resist photoresist composition suitable for use in 193 nm photolithographic processes.

The novel terpolymers of this invention have the following structural units: about 1 to 55 wt % of units of the formula about 35 to 77 wt % of units of the formula

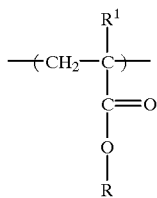

and about 16 to 40 wt % of units of the formula

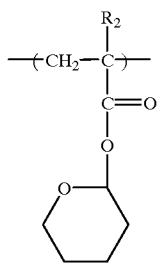

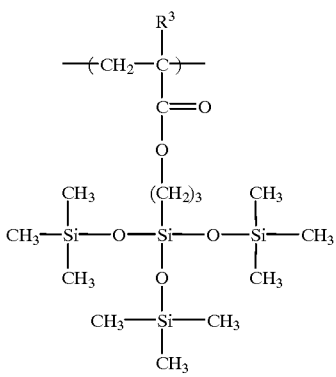

In the above-described structural units, R is a methyl or hydroxyethyl group, $R^1$ is a hydrogen atom, a methyl group or a —$CH_2COOCH_3$ group and $R^2$ and $R^3$ are each independently a hydrogen atom or a methyl group.

A photoresist composition for forming a photoimageable top layer coating in a 193 nm bilayer system are produced from these terpolymers by forming the photoresist composition from the terpolymer, a suitable photoacid generator (PAG) compound, a base comprising 2,4,5-triphenylimidazole (TPI), and a solvent comprising ethyl lactate (EL), propylene glycol methyl ether acetate (PGMEA) or a mixture of said solvents.

A bilayer coated substrate for use in 193 nm photolithography is produced by applying an undercoat or planarizing layer to the substrate and then applying onto the undercoated substrate a photoimageable top layer from the photoresist composition of the terpolymer as described in the previous paragraph. The new terpolymers of this invention provide photoresist compositions suitable for use at 193 nm wavelength that produce an excellent combination of adhesion, resolution and plasma etch resistance.

DETAILED DESCRIPTION OF THE INVENTION

The terpolymers of this invention can be prepared from the corresponding monomers by any suitable conventional polymerization processes, such as for example, by free radical, controlled radical or group transfer polymerization.

The number average molecular weight Mn, of the terpolymers of the invention can range from about 7,000 to about 40,000, preferable from about 8,000 to about 25,000, and most preferably from about 10,000 to about 20,000.

As illustrative examples of terpolymers of this invention, there can be mentioned a terpolymer comprising about 71 mol % tetrahydropyranyl methacrylate units, about 13 mol % methylmethacrylate units and about 16 mol % methylacryloxypropyltris (trimethylsiloxy) silane units, and a terpolymer of said units comprising about 52/30/18 mol % of the units, respectively. Generally, terpolymers with less than about 52 mol % tetrahydropyranyl methacrylate units or higher than 18 mol % of the silicon-containing units do not perform well in photoresist compositions since they experience micropeeling and adhesion loss.

Preferably in the units of the terpolymers R, $R^1$, $R^2$ and $R^3$ are each methyl groups.

The terpolymers of this invention are used with a photoacid generator compound (PAG) to form radiation-sensitive photoresist compositions for providing a photoimageable top coat layer of a 193 nm bilayer system. The radiation-sensitive compositions of this invention will generally contain about 80 to about 99.9 wt % of the terpolymer of this invention, about 0.1 to about 10 wt % photoacid generator (PAG) and 2,4,5-triphenylimidazole (TPI) base in an amount of from about 1 to about 5 parts base per 5 parts PAG compound, i.e., a ratio of PAG/TPI of from about 5:1 to 1:1; preferably about 3.33:1 to 1:1.

This ratio of PAG to TPI base is quite different than the ratio of PAG to base, namely 10:1 to 40:1, usually employed with such photoresist compositions. At a ratio above 5:1, micropeeling occurs and below the ratio of 1:1, photospeed is too slow and scumming occurs.

It has been discovered that bases other than TPI with the terpolymers of this invention do not provide radiation-sensitive compositions with acceptable photolithographic properties. Other bases produce compositions with photospeeds that are too fast and usually produce micropeeling as demonstrated in the comparative results presented hereinafter. Similarly, it has been discovered that the components of the radiation-sensitive composition are to be dissolved in an ethyl lactate or propylene glycol methyl ether acetate or mixtures thereof, otherwise the compositions are characterized as non-imageable because of the photospeed being either too fast or too slow.

Any suitable photoacid generator, particularly onium sulfonate salts, which generate acid under the effects of active radiation from exposure sources ranging from election beam, ArF excimer lasers and KrF excimer lasers can be used to form the radiation-sensitive compositions with the terpolymers of this invention to prepare the radiation-sensitive photoresist compositions of this invention.

Among the suitable onium sulfonate salts, there may be mentioned particularly aryl sulfonium and iodonium sulfonates, especially triaryl sulfonium and iodonium sulfonates. The aryl groups of the sulfonium or iodonium moieties may be substituted or unsubstituted aryl groups, such as unsubstituted phenyl or naphthyl, or these moieties may be substituted by one or more substituents such as halogen, $C_{1-4}$ alkyl, $C_{1-4}$ alkoxy, —OH and/or nitro substituents. The aryl groups or substituents on each aryl group may be the same or different.

The anion of the photoacid generator may be any suitable anion of a suitable organic sulfonic acid, such as acids of aliphatic, cycloaliphatic, carbocyclic-aromatic, heterocyclic-aromatic or araliphatic sulfonic acids. These anions may be substituted or unsubstituted. Partially fluorinated or perfluorinated sulfonic acid derivatives or sulfonic acid derivatives substituted in the neighboring position to the respective acid group are preferred. Examples of substituents are halogens, such as chlorine, and particularly fluorine, alkyl, such as methyl, ethyl or n-propyl, or alkoxy, such as methoxy, ethoxy or n-propoxy and the like.

Preferably the anion is a monovalant anion from a partially fluorinated or perfluorinated sulfonic acid. Preferred are fluorinated lower alkyl sulfonate anions.

Special examples of suitable onium salts are triphenyl sulfonium bromide, triphenyl sulfonium chloride, triphenyl sulfonium iodide, triphenylsulfonium methane sulfonate, triphenylsulfonium trifluoromethane sulfonate, triphenylsulfonium hexafluoropropane sulfonate, triphenylsulfonium nonafluorobutane sulfonate, triphenylsulfonium phenyl sulfonate, triphenylsulfonium 4-methylphenyl sulfonate, triphenylsulfonium 4-methoxyphenyl sulfonate, triphenylsulfonium 4-chlorophenyl sulfonate, triphenylsulfonium camphorsulfonate, 4-methylphenyl-diphenylsulfonium trifluoromethane sulfonate, bis(4-methylphenyl)-phenylsulfonium trifluoromethane sulfonate, tris-4-methylphenylsulfonium trifluoromethane sulfonate, 4-tert-butylphenyl-diphenylsulfonium trifluoromethane sulfonate, 4-methoxyphenyl-diphenylsulfonium trifluoromethane sulfonate, mesityl-diphenylsulfonium trifluoromethane sulfonate, 4-chlorophenyldiphenylsulfonium trifluoromethane sulfonate, bis-(4-chlorophenyl)-phenylsulfonium trifluoromethane sulfonate, tris-(4-chlorophenyl) sulfonium trifluoromethane sulfonate, 4-methylphenyl-diphenylsulfonium hexafluoropropane sulfonate, bis(4-methylphenyl)-phenylsulfonium hexafluoropropane sulfonate, tris4-methylphenylsulfonium hexafluoropropane sulfonate, 4-tert-butylphenyl-diphenylsulfonium hexafluoropropane sulfonate, 4-methoxyphenyl-diphenylsulfonium hexafluoropropane sulfonate, mesityl-diphenylsulfonium hexafluoropropane sulfonate, mesityl-diphenylsulfonium hexafluoropropane sulfonate, 4-chlorophenyl-diphenylsulfonium hexafluoropropane sulfonate, bis-(4-chlorophenyl)-phenylsulfonium hexafluoropropane sulfonate, tris-(4-chlorophenyl) sulfonium hexafluoropropane sulfonate, diphenyliodonium trifluoromethane sulfonate, diphenyliodonium hexafluoropropane sulfonate, diphenyliodonium 4-methylphenyl sulfonate, bis-(4-tert-butylphenyl)iodonium trifluoromethane sulfonate, bis-(4-tert-butylphenyl)iodonium hexafluoropropane sulfonate, bis-(4-cyclohexylphenyl)iodonium trifluoromethane sulfonate, and bis-(4-cyclohexylphenyl)iodonium hexafluoropropane sulfonate. Particularly preferred is triphenyl sulfonium trifluoromethane sulfonate (triphenyl sulfonium triflate).

The photoresist compositions of the invention may also contain suitable conventional additives in conventional quantities, stabilizers, pigments, dyes, colorants, fillers, anti-striation agents, bonding agents, leveling agents, wetting agents and softeners, generally in an amount of up to about 3% by weight of the total composition.

Preferably, the photoresist compositions are dissolved in one of the suitable solvents for the application. The selection of the solvent and the concentration are primarily directed according to the type of composition and according to the coating process.

The radiation-sensitive resist formulations according to the invention may be produced, for example, by mixing of the individual components with stirring, whereby a homogeneous solution is obtained.

The compositions of the invention are suitable as positive photoresists, which dissolve better in an aqueous-alkaline solution after radiation, and a subsequent heat treatment, if needed.

Another aspect of this invention is a process for the lithographic treatment of a substrate by means of a multi-layer technique, in which:

the substrate is provided with a first coating of a film-forming aromatic polymer material and then suitably cured, a second coating containing a terpolymer of the invention and a substance that forms acid under the effect of actinic radiation of a wavelength of about 193 nm, is introduced on this first coating, the thus-coated substrate is irradiated in an image-forming way with radiation of a wavelength of 248 to 254 or of 193 nm, to which the photoacid generator is sensitive, the irradiated substrate is subjected to a heat treatment, the heat treated irradiated substrate is treated with an aqueous alkaline developer solution, until the irradiated regions of the second coating are removed, and after this, the substrate is treated with an oxygen-containing plasma until the first coating is completely removed on those places where it is not covered by the second coating.

Any suitable film-forming organic polymers can be used as the film-forming organic material for the first coating (undercoat layer) with the use of the multilayer technique. Particularly preferred are phenolic resins, particularly novolak resins, such as formaldehyde cresol or formaldehyde phenol novolaks, polyimide resins, poly(meth) acrylate resins and styrene-allyl alcohol copolymer resins, the latter being preferred. The undercoat layer is generally 0.5 to 1 $\mu$m thick. The resin is first dissolved in a suitable solvent and then introduced by the usual coating processes onto the substrate, e.g., by dipping, blade coating, painting, spraying, particularly by electrostatic spraying, and reverse-role coating, and above all by spinning, and subsequently cured by methods known in the art.

After the first layer is dried and cured, the second coating, containing a terpolymer of the invention, a substance that forms acid under the effect of actinic radiation of a wavelength below 300 nm, preferably below 260 nm, and more preferably at about 193 nm, as well as other additives, if needed, is introduced onto the first coating. The second coating may also be produced with any conventional coating process, for example, one of those named above, but here also spin coating is particularly preferred. The covering layer is appropriately approximately 0.2 to 0.5 $\mu$m thick.

For the production of relief structures, the thus-coated substrate is then selectively exposed, i.e., to form the image. Exposure is preferably produced with actinic radiation of a wavelength of 190–300 nm, particularly of 190 to 260 nm. All known sources of the respective radiation can be utilized in principle for irradiation, for example, mercury high-pressure lamps, but particularly excimer lasers, such as the krypton fluoride (KrF) laser with radiation of 248 nm wavelength or the argon fluoride (ArF) excimer laser with 193 nm radiation. The image-forming irradiation is produced either by means of a mask, preferably a chromium-quartz mask, or—when laser exposure devices are used—also by moving the laser beam in a computer-controlled manner over the surface of the coated substrate and thus the image is produced. Here, the high sensitivity of the photoresist materials of the invention is very advantageously noticeable in that it permits high writing speeds at relatively low intensities. The high sensitivity of the resist is also of advantage for exposure by means of steppers, where very short exposure times are desired.

The process of the invention also encompasses, between selective irradiation and treatment with a developer, a heating of the coating as a further process measure. By means of this heat treatment, the so-called "post-exposure bake", a practically complete reaction of the resist material, is obtained in an especially rapid time. The time and temperature of this post-exposure bake may vary within broad regions and essentially depend on the composition of the resist, particularly by the type of its acid-sensitive photoacid generator used, as well as the concentrations of these two components. Commonly, the exposed resist is subjected to several seconds up to several minutes of temperatures of approximately 50–150° C.

After the image-forming exposure and heat treatment of the material conducted as needed, the irradiation areas of the top coat that are more soluble in aqueous alkaline as a consequence of the irradiation are dissolved out with an aqueous-alkaline developer, i.e., with an aqueous solution of bases to which small quantities of organic solvents or their mixtures may also be added as needed.

Particularly preferred as developers are aqueous alkaline solution, as they are also utilized for the development of conventional novolak naphthoquinone diazide positive resist coatings. These include, e.g., aqueous solutions of alkali metal silicates, phosphates, hydroxides, and carbonates, but particularly tetraalkylammonium hydroxide solutions, such as e.g., tetramethylammonium hydroxide solution, which is free of metal ions. Still smaller quantities of wetting agents and/or organic solvents may also be added to these solutions. Typical organic solvents, which may be added to the developer fluids, are, for example, 2-ethoxyethanol, isopropanol or ethanol, as well as mixtures of two or more of these solvents.

After this, the thus-treated workpiece is treated with an oxygen or oxygen-containing plasma, whereby a closed silicon oxide layer is formed within several seconds, at least in the uppermost regions of the top coating of organosilicon components in the covering layer, and this silicon oxide layer protects the regions of the organic material lying underneath against an attack of oxygen plasma. Treatment with the oxygen plasma is continued until the substrate is completely free in those places where the top coating has been removed beforehand by means of the developer. In general, an etching time of 5 to 15 minutes is sufficient for this purpose.

The substrate can finally be subjected to a conventional structuring treatment, e.g., a dry etching in halogen or fluorocarbon plasmas on those places free of the coating. After this, the entire protective coating is removed from the substrate, e.g., by dissolving with a suitable stripper or by $O_2$ plasma ashing, after which the depicted process cycle is repeated, if needed, in order to produce further structures on the substrate. Therefore, a process for the production of an object, particularly an electronic component, comprising the above-depicted process for the lithographic treatment of a substrate forms another embodiment of the invention.

The present invention is further illustrated by the following Examples. All parts and percentages are by weight and all temperatures are degrees Celsius unless explicitly stated otherwise.

EXAMPLE 1
Preparation of Terpolymer
In a 1000 ml three-neck round-bottomed flask with mechanical stirrer, addition funnel, condenser and $N_2$ inlet-outlet, 240 g tetrahydropyranylmethacrylate, 34 g of methyl methacrylate and 136 g methacryloxypropyltris (trimethysiloxy) silane(CAS # 17096-07-0) were added under nitrogen flow. Tetrahydrofuran (THF) 400 ml, the polymerization initiator (6 g VAZO™ 67) and 4.4 ml 1-dodecanethiol were added and the temperature maintained at 69° C. for 20 hours. Finally, the random terpolymer was precipitated into 4 L of hexanes, redissolved in 400 ml THF and reprecipitated in 4 L of hexanes and dried at 4 mbar for 24 hours. Molecular weights (Mn, Mw) and molecular weights distributions (Mw/Mn) were measured using a Waters Corp. liquid chromatograph (refractive index detection, Millenium (GPC V software)), equipped with the following Phenogel-10, 7.8×250 mm columns: 10–4 A, 500 A, 100 A & 50 A (from Phenomenex) and THF eluent. (Mn=1,670; PD=1.78). The structure and composition of the terpolymer was analyzed using a Bruker 250 MHz proton NMR-spectrometer and found to be consistent with the expected composition.

EXAMPLE 2
Photoresist Formulation
For 200 ml of resist solution (total 9.5 wt % solids) 18.26 g of the terpolymer of Example 1 were dissolved in 71.54 g of propylene glycol methyl ether acetate (PGMEA). 34.20 g of 2,4,5-triphenylimidazole solution (0.5 wt % 2,4,5-triphenylimidazole in PGMEA) and 76.00 g of triphenylsulfonium-triflate solution (0.75 wt % in PGMEA) were added. After 4 hours mixing on a roller the resist solution was filtered twice through 0.1 $\mu$m Teflon filters.

EXAMPLE 3
Preparation of undercoat solution and film
80 g of a styrene-allyl alcohol copolymer, commercially available from Scientific Polymer Products, Inc., and 12 g of 1,1'-(3-methylethylidene) bis[4-(4-azidophenoxy)-benzene] (CAS # 71550-57-7) were dissolved in 408 g of PGMEA and filtered twice through 0.1 $\mu$m filters to yield an undercoat solution. The undercoat was spun coated on a silicon water and baked at 120° C. for 60 seconds to yield a 0.5 micron thick film. The undercoat film was then Deep UV cured using a Fusion System DUV cure unit model number M150PC. The wafer was heated at 85° C. for 10 seconds at low lamp intensity. The temperature was then ramped to 120° C. over 30 seconds with the lamp on high intensity. The temperature was maintained at 125° C. for 20–60 seconds, the time depending on which particular unit was being used. The lamp intensity remained high during this period. The wafer was then removed from the Fusion cure system and cooled to room temperature. The cured film usually was approximately 0.45 $\mu$m thick.

EXAMPLE 4
Preparation of resist film
A silicon wafer with undercoat prepared in Example 3, was spun-coated with the photoresist formulation of Example 2 and baked at 100° C. for 1 minute to yield a 0.25 $\mu$m thick film on top of the undercoat. The coated wafer was then imagewise exposed using a 0.6 NA ISI 193 nm Microstepper. The wafer was then post exposure baked at 100° C. for 1 minute. The film was then immersion developed for 30 seconds in 0.262 N aqueous tetramethylammonium hydroxide (TMAH); rinsed, and spun dry. Images from scanning electron microscopy showed the resist could resolve US features as small as 0.12 micron.

Pattern transfer through the undercoat The undercoat pattern transfer was carried out using a Trikon (formerly PMT) Pinnacle 8000 HDP etcher. The etching conditions were 1375 W (source), 350 W (bias), −30° C. and 60 sccm $O_2$ flow at 1.875 mtorr. Images from scanning electron microscopy after the etch showed the resist/undercoat stack could resolve L/S features as small as 0.13 micron.

EXAMPLES 5 AND 6 AND COMPARATIVE EXAMPLES A THROUGH K

As stated hereinbefore the photoresist compositions of the terpolymer of this invention utilize 2,4,5-triphenylimidazole as the base since other bases produce photoresist compositions that result in micropeeling and photospeeds that are too fast as shown by the following examples. The terpolymer used in these examples was similar to the terpolymer produced in Example 1, the solvent was PGMEA and the PAG was triphenylsulfonium triflate used at 3 wt % of the photoresist composition.

The bases evaluated were the base of this invention, namely 2,4,5-triphenylimidazole (TPI), and comparative bases hexamethyltriethylenetetraamine (HMETA), tetramethyl-hexanediamine (TMHD), oxydianiline (ODA), piperonylamine (pip.am.), N, N-dimethylformamide di-t-butylacetal (di-Bu a.) and N, N-dimethylformamide diisopropyl acetal (diprop. a.).

The results of exposure using a 0.5 NA 193 nm scanner of the photoresist coating from photoresist compositions containing the aforementioned bases are presented in the following Table. Resolution was determined using line/space patterns.

TABLE

| Example | Base | PAG/base weight ratio | Results |
|---|---|---|---|
| 5 | TPI | 3.33 | clean imaging, vertical wall profiles, resolution 0.16 μm (about 9 mJ/cm2), slight micropeeling at partially resolved 0.12 μm features (Mn of polymer = 9300) |
| 6 | TPI | 3.33 | clean imaging, vertical wall profiles, slightly T-topped profiles, resolution 0.18 μm (Mn of polymer = 11000) |
| A | HMTETA | 4.29 | distorted images, poor resolution bridging, and scum. |
| B | TMHD | 5.75 | distorted images, poor resolution bridging, and scum. |
| C | ODA | 10.00 | resolution about 0.18 μm, with good wall profiles, but somewhat scummy |
| D | pip.am. | 12.50 | extremely overexposed at about 1.5 mJ/cm2 (lowest dose possible) |
| E | pip.am. | 4.00 | massive micropeeling |
| F | pip.am. | 1.20 | massive micropeeling, 1 μm 1:1 at 4 mJ |
| G | di-Bu a. | 4.55 | overexposed at about 1.5 mJ/cm2 (lowest dose possible) |
| H | di-Bu a. | 1.52 | overexposed, micropeeled |
| I | di-Bu a. | .45 | very overexposed at about 1.5 mJ/cm2 (lowest dose possible) |
| J | diprop. a. | 5.26 | overexposed at about 1.5 mJ/cm2 (lowest dose possible) |
| K | diprop. a. | 1.72 | overexposed, micropeeled |

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

We claim:

1. A radiation-sensitive terpolymer comprising recurring units of the formulae
about 1 to 55 wt % of units of the formula

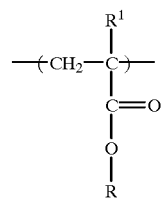

about 35 to 77 wt % of units of the formula

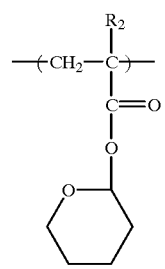

and about 16 to 40 wt % of units of the formula

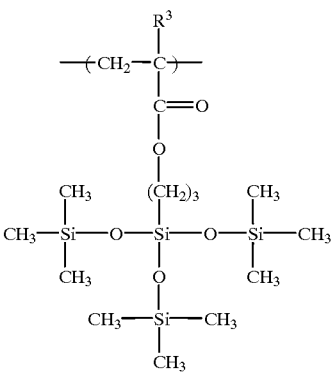

based on the weight of the polymer, and wherein R is a methyl or hydroxyethyl group, $R^1$ is a hydrogen atom, a methyl group or a $CH_2COCH_3$ group, and $R^2$ and $R^3$ are each independently selected from a hydrogen atom or a methyl group.

2. A terpolymer as claimed in claim 1, wherein each of R, $R^1$, $R^2$ and $R^3$ is a methyl group.

3. A terpolymer as claimed in claim 2 comprising about 30 mol % of methyl methacrylate units, about 52 mol % of tetrahydropyranyl methacrylate units, and about 18 mol % of methacryloxypropyltris(trimethylsiloxy) silane units.

4. A terpolymer as claimed in claim 2 comprising about 13 mol % of methyl methacrylate units, about 71 mol % of tetrahydropyranyl methacrylate units, and about 16 mol % of methacryloxypropyltris(trimethylsiloxy) silane units.

5. A terpolymer as claimed in claim 1, wherein the molecular weight (Mn) of the terpolymer is from about 8,000 to about 25,000.

6. A terpolymer as claimed in claim 3, wherein the molecular weight (Mn) of the terpolymer is from about 10,000 to about 20,000.

7. A radiation-sensitive composition comprising:

a terpolymer having recurring units of the formulae about 1 to 55 wt % of units of the formula

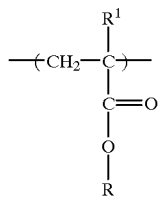

about 35 to 77 wt % of units of the formula

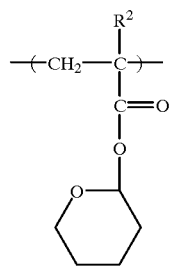

and about 16 to 40 wt % of units of the formula

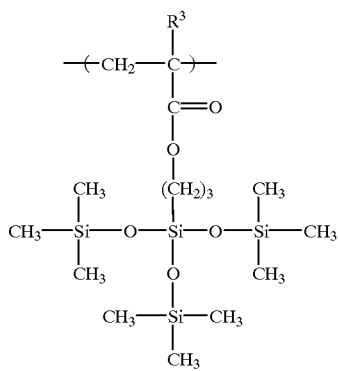

based on the weight of the polymer, and wherein R is a methyl or hydroxyethyl group, $R^1$ is a hydrogen atom, a methyl group or a $CH_2COCH_3$ group, and $R^2$ and $R^3$ are each independently selected from a hydrogen atom or a methyl group.

a photosensitive compound which generates an acid upon exposure to actinic radiation, a solvent capable of dissolving the terpolymer and the photosensitive acid generating compound, said solvent being selected from ethyl lactate, propylene glycol methyl ether acetate and mixtures thereof, and 2,4,5-triphenylimidazole.

8. A radiation-sensitive composition as claimed in claim 7, wherein the weight ratio of photosensitive acid generating compound to 2,4,5-triphenylimidazole is in the range of from about 3:33:1 to 1:1.

9. A radiation-sensitive composition as claimed in claim 7, wherein the photosensitive acid generating compound is an onium compound.

10. A radiation-sensitive composition as claimed in claim 9, wherein the photosensitive acid generating compound is a sulfonium salt.

11. A radiation-sensitive composition as claimed in claim 9, wherein the photosensitive acid generating compound is triphenylsulfonium triflate.

12. A radiation-sensitive composition as claimed in claim 11, wherein the terpolymer comprises about 13 mol % of methyl methacrylate units, about 71 mol % of tetrahydropyranyl methacrylate units, and about 16 mol % of methacryloxypropyltris(trimethylsiloxy) silane units, based on the weight of the polymer.

13. A process for forming a pattern on a substrate which comprises:

(a) coating a photoresist coating of the radiation-sensitive composition as claimed in claim 7 over an aromatic polymer undercoat on a substrate, (b) exposing portions of the photoresist coating to actinic radiation, and (c) developing the photoresist coating with a developing solution to provide a patterned substrate.

14. A process as claimed in claim 13, wherein the actinic radiation has a wavelength of about 193 nm.

15. A process as claimed in claim 14, wherein the aromatic polymer of the undercoat is a styrene-allyl alcohol copolymer.

16. The process for the lithographic treatment of a substrate, comprising:

(a) providing an undercoat of a film-forming aromatic polymer on the substrate, (b) providing over the undercoat a second coating containing a terpolymer according to claim 1 and a photoacid generating compound that generates acid under the effect of actinic radiation of a wavelength of about 193 nm, (c) irradiating the thus-coated substrate in an image-forming manner with radiation of a wavelength is of about 193 nm, (d) subjecting the irradiated substrate to heat, (e) treating the irradiated substrate with an aqueous-alkaline developer solution until the irradiated regions of the second coating are removed, and (f) treating the coated substrate with an oxygen-containing plasma until the undercoat is completely removed on those places where it is not covered by the second coating.

17. A patterned substrate produced according to the process of claim 13.

18. A lithographically treated substrate produced according to the process of claim 16.

* * * * *